United States Patent [19]

Burdick

[11] 4,378,525

[45] Mar. 29, 1983

[54] METHOD AND APPARATUS FOR MEASURING A DC CURRENT IN A WIRE WITHOUT MAKING A DIRECT CONNECTION TO THE WIRE

[76] Inventor: Neal M. Burdick, 6371 Celia Vista Dr., San Diego, Calif. 92115

[21] Appl. No.: 188,581

[22] Filed: Sep. 18, 1980

[51] Int. Cl.³ .................. G01R 1/22; G01R 33/00
[52] U.S. Cl. .................. 324/127; 324/117 R
[58] Field of Search ............ 324/117 R, 127, 102, 324/244, 259, 260

[56] References Cited

U.S. PATENT DOCUMENTS

| | | | |
|---|---|---|---|
| 1,825,514 | 9/1931 | Fitzgerald . | |
| 1,942,065 | 1/1934 | Lorraine | 175/183 |
| 2,266,624 | 12/1941 | Hall | 171/95 |
| 2,760,158 | 8/1956 | Kerns | 324/99 |
| 2,996,682 | 8/1961 | Miller | 330/8 |
| 3,323,056 | 5/1967 | Haley | 324/117 |
| 3,333,192 | 7/1967 | Geyger | 324/117 |
| 3,396,338 | 8/1968 | Buchanan et al. | 324/117 |
| 3,426,276 | 2/1969 | Schweitzer, Jr. | 324/127 |
| 3,584,299 | 7/1969 | Caete | 324/86 |
| 3,706,032 | 12/1972 | Vikstrom | 324/127 |
| 3,781,682 | 12/1973 | Schweitzer, Jr. | 324/133 |
| 3,812,428 | 5/1974 | Trenkler | 324/127 |
| 3,882,387 | 5/1975 | Vikstrom | 324/117 R |
| 3,913,015 | 10/1975 | Bronaugh et al. | 324/127 |
| 3,984,798 | 10/1976 | Bussen | 336/176 |
| 4,005,380 | 1/1977 | Heilmann et al. | 336/84 |

OTHER PUBLICATIONS

Advertisment re: Hewlett Packard Clip-On Milliammeter.
Advertisment re: Bell Current Gun.
Advertisment re: Tektronix P6303 and P6302 current probes, 1978, Tektronix Catalog.

Primary Examiner—Ernest F. Karlsen
Attorney, Agent, or Firm—Brown & Martin

[57] ABSTRACT

A pair of semi-circular, hard magnetic sensors are rigidly fixed within separate blocks which are in turn removably received in corresponding housings mounted to the jaws of a spring biased clamp. The clamp is adapted for positioning the sensors into a split ring around a wire carrying the DC current to be measured. According to a first embodiment of the method, longitudinally wound coils about each of the sensors are momentarily energized by an AC current source connected thereto through a variable transformer, while the sensors are around the wire. Thereafter the sensors are removed from the clamp and placed side by side beneath a compass so that the magnetic flux previously induced in the sensors deflects the compass needle from North. Circumferentially wound coils about each of the sensors are connected to a DC current source which is varied to move the compass needle back to North by cancelling the magnetic flux previously induced in the sensors. The amount of current required to move the compass needle back to North provides an indication of the amplitude of the DC current flowing through the wire about which the sensors were clamped. In a second embodiment of the method, after the sensors have been removed from around the wire, a ballistic galvanometer is connected to the circumferential coils about the sensors. The longitudinal coils about the sensors are energized to cause the magnetic flux previously induced in the sensors to be cancelled. The change in magnetic flux measured by the ballistic galvanometer provides an indication of the amount of DC current flowing through the wire.

13 Claims, 11 Drawing Figures

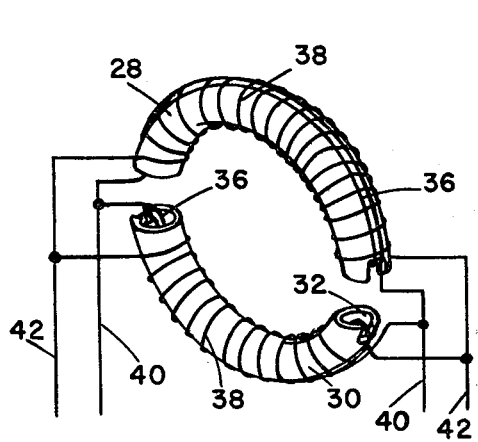
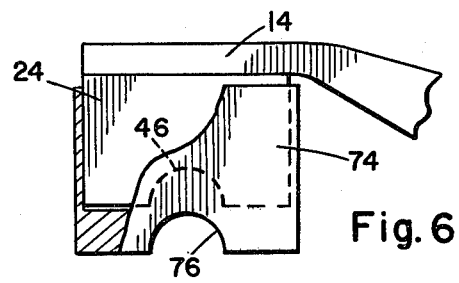
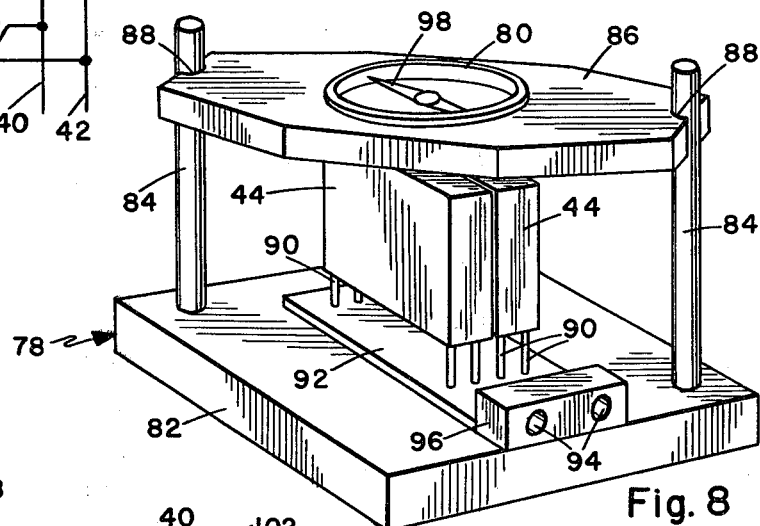
Fig. 7　Fig. 6　Fig. 8
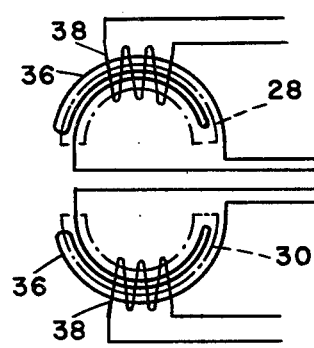
Fig. 9
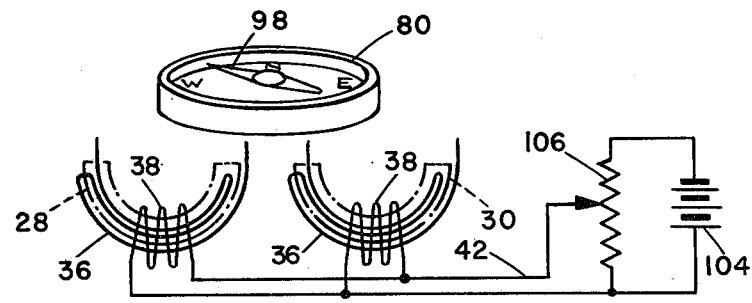
Fig. 10
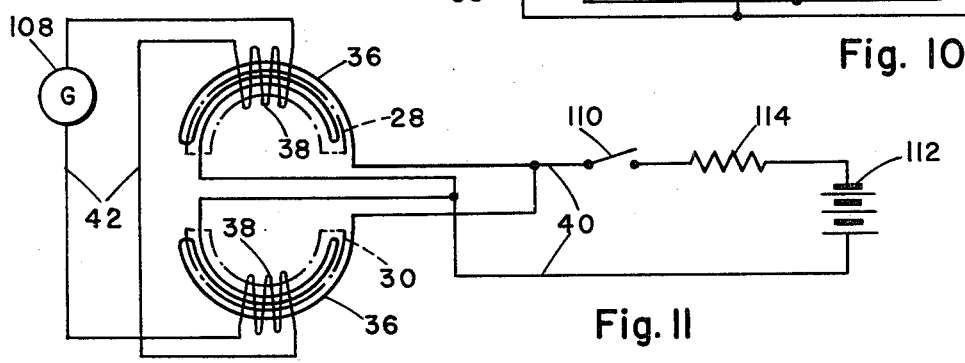
Fig. 11

METHOD AND APPARATUS FOR MEASURING A DC CURRENT IN A WIRE WITHOUT MAKING A DIRECT CONNECTION TO THE WIRE

BACKGROUND OF THE INVENTION

The present invention relates to electrical current measuring devices, and more particularly, to an improved method and apparatus for measuring DC current flowing through a wire without making any direct connection to the wire.

For purposes of the discussion herein, reference will be made to two classes of magnetic material. One class is that of high permeability, high mu, soft magnetic material whose magnetic domains can rotate or turn easily with little or no friction. The other class is that of high retentivity, permanent magnet, hard magnetic material whose magnetic domains turn or rotate with difficulty because of significant friction. These two classes of magnetic material are mutually exclusive since a material cannot have both types of magnetic properties at the same time.

If a torroidal core of soft magnetic material is placed around a current carrying wire, the magnetomotive force created by the current in the wire will orient the domains in the core so that North and South poles are aligned with the central, longitudinal axis of the core. A net increase in magnetic flux results, and the core is said to be magnetized.

If a core of soft magnetic material having a split ring construction is removed around a current carrying wire, the core will lose its magnetism because of self-demagnetization. Thus, there is no retained magnetism in the split ring core which can be measured as an indicator of the amount of current flowing through the wire.

U.S. Pat. No. 2,996,682, Miller, discloses in FIG. 11 a current measuring device in which a closed core of what is apparently soft magnetic material contains a central, broken ring conductor. Three spaced apart coils are wound circumferentially about the core. A continuous current may be applied to the central conductor and a DC current to be measured may be applied to one of the circumferential coils. The current induced in one of the other circumferential coils is detected to provide an indication of the DC current being measured.

If a toroidal core of a hard magnetic material is placed around a current carrying wire the magnetomotive force created by the current will not rotate or otherwise change the direction of the domains until the friction of turning the domains is overcome. Thus, in some instances the current in the wire does not change the magnetization of the core and there is no increase or decrease in the flux until the current reaches a predetermined value. However, if the core of hard magnetic material has a split ring construction, it can then be removed from the wire without a loss in magnetization because the friction characteristic of this type of magnetic material prevents the domains from reorienting themselves and demagnetizing the ring. Thus, the information in the magnetic material due to magnetization thereof is not lost when the split ring is removed from about the wire as happens in the case of soft magnetic core.

U.S. Pat. No. 1,942,065, Lorraine, discloses a surge current measuring device. A pair of cylindrical elements made of hard magnetic material are placed in the vicinity of a current carrying wire. As shown in FIG. 7 of the Lorraine patent, the magnetic elements may be subjected to a continuous steady state DC current of known amplitude through coils circumferentially wound about the elements. The resultant magnetic flux induced in the elements after a surge of current through the wire is measured by placing the elements in an instrument to provide a quantative indication of the current surge. In the Lorraine patent, the final amount of magnetic flux induced in the elements depends upon their prior history of magnetization. The magnetic flux induced in the elements as a result of a current surge in the adjacent wire is generally non-linear because the method depends upon the non-linear hysteresis curves of the hard magnetic material of the elements. The time at which the magnetic flux is induced in the elements is unknown since it results from a random current surge. The current surge may be due to an event such as a flash over in a power transmission line during a lightening discharge. Furthermore the Lorraine method is primarily adapted for measuring the maximum value of a surge current whether it is unidirectional or oscillatory. It is not adapted for measuring a constant DC current flowing through a wire.

U.S. Pat. No. 4,005,380 Heilmann et al, discloses a clamp-on device for detecting current pulses in a wire. Ferrite core halves are mounted in respective jaw shells of a spring biased clamp. U.S. Pat. No. 3,706,032, Vikstrom, discloses another clamp-on DC current detector.

Other patents of interest in this field are U.S. Pat. Nos. 1,825,514; 2,266,624; 2,760,158; 3,323,056; 3,333,192; 3,396,338; 3,426,276; 3,584,299; 3,781,682; 3,812,428; 3,882,387; 3,913,015; and 3,984,798.

SUMMARY OF THE INVENTION

It is therefore the primary object of the present invention to provide an improved method and apparatus for measuring a DC current flowing through a wire without making any direct connection to the wire.

It is another object of the present invention to provide an improved method and apparatus of the aforementioned type which will permit variations in DC current as small as plus or minus thirty milliamps to be measured.

It is still a further object of the present invention to provide improved construction for a clamp-on device for measuring DC current flowing a wire without making any direct connection to the wire.

According to the present invention, a split ring made of a hard magnetic material is placed around a DC current carrying wire. The split ring is subjected to predetermined magnetomotive forces that allow the magnetic domains in its hard magnetic material to overcome their friction and align themselves proportional to the current flowing through the wire. The magnetomotive forces may be created by applying a transient wave form signal to coils wound about the ring so that the magnetomotive forces generated by the coils are orthogonal to those emanating from the current carrying wire.

The present invention includes a novel clamp-on device for measuring the amplitude of a DC current flowing through a wire without making a direct connection thereto. A pair of semi-circular magnetic sensors made of a hard magnetic material are rigidly fixed within separate blocks which are in turn removably received in separate housings mounted to the jaws of a spring biased clamp. The clamp is adapted for positioning the sensors into a split ring around the wire carrying the DC current to be measured. Each of the semi-circular sensors has both circumferential and longitudinal coils wound thereabout.

According to a first embodiment of the method of the present invention the sensors are first placed around the wire carrying current to be measured by mounting blocks holding the sensors in the housings of the clamp jaws and by operating the clamp to place the housings in end to end abutting relationship around the wire. The longitudinally wound coils of each of the sensors are connected by wires in the clamp to an AC current source through a variable transformer. The variable transformer is operated to momentarily energize the longitudinal coils wound about the sensors. Thereafter the blocks holding the sensors are removed from the housings of the clamp jaws and are mounted side by side, beneath a compass. The magnetic flux previously induced in the sensors deflects the compass needle from North. The circumferential coils wound about the sensors are connected to a source of DC current which is varied to move the compass needle back to North by cancelling the magnetic flux previously induced in the sensors. The amount of current required to move the compass needle back to North provides an indication of the amplitude of the DC current flowing through the wire about which the sensors were previously clamped.

In a second embodiment of the method of the present invention, the sensors are clamped about the current carrying wire and magnetic flux is induced therein as in the first embodiment of the method. The sensors are then removed from around the wire, and a ballistic galvanometer is connected to the circumferential coils wound about the sensors. The longitudinal coils surrounding the sensors are then energized to cause the magnetic flux in the sensors to be cancelled. The change in the magnetic flux measured by the ballistic galvanometer provides an indication of the amount of DC current flowing through the wire.

The semi-circular sensors are preferably each rigidly fixed within blocks which are specially constructed so that their positions within the housings mounted to the clamp jaws can be quickly adjusted. This permits the distance between the sensors when they are about the wire to be preselected and thus the sensitivity of the device can be varied in this manner. Also, the device may include magnetic shunts adapted to fit over the housings and absorb some of the magnetic flux emanating from the wire carrying the current to be measured. This also changes the sensitivity of the device and allows currents of greater amplitude to be measured.

BRIEF DESCRIPTION OF THE DRAWINGS

FIG. 6 is a fragmentary, side elevational view of a magnetic shunt which may be placed over the housings of the clamp to absorb magnetic flux and enable currents of greater magnitude to be measured.

FIG. 7 illustrates the manner in which the circumferential and longitudinal coils are wound about the magnetic sensors.

FIG. 8 illustrates a preferred form of an instrument which may be utilized to support the blocks beneath a compass so that the magnetic flux induced in the magnetic sensors within the blocks can be measured.

FIG. 9 is a schematic diagram illustrating the manner in which the semi-circular magnetic sensors may be placed around a wire carrying current to be measured, and longitudinal coils wound about the sensors energized by an AC current source through a variable transformer.

FIG. 10 is a schematic diagram illustrating the manner in which the pair of sensors may be positioned side by side beneath a compass and their circumferential coils connected to a variable DC current source to cancel the magnetic flux previously induced in the sensors and return the deflected needle of the compass to North.

FIG. 11 is a schematic diagram illustrating a portion of an alternate method of the present invention in which the circumferential coils wound about the sensors are connected to a ballistic galvanometer and the longitudinal coils are energized to cancel the magnetic flux previously induced in the sensors and so that the net change in magnetic flux can be indicated by the ballistic galvanometer.

Throughout the figures like reference numerals refer to like parts.

DESCRIPTION OF THE PREFERRED EMBODIMENTS

Initially, preferred embodiments of the apparatus of the present invention will be described. Thereafter, several preferred embodiments of the method of the present invention will be described.

Figure 1:
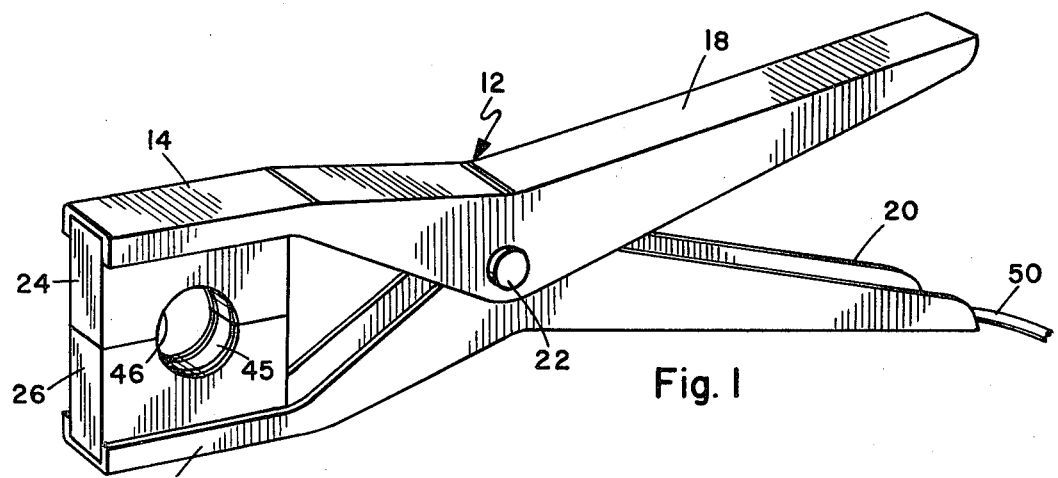
FIG. 1 is a perspective view of a preferred embodiment of the clamp of the present invention which is utilized to hold a pair of semi-circular magnetic sensors in split ring configuration around a wire carrying the current to be measured.

Turning first to FIG. 1, there is shown a clamp 12 having a pair of jaws 14 and 16 and a pair of handles 18 and 20. The jaws and handles of the clamp are pivoted about a pin 22. A pair of hollow rectangular housings 24 and 26 are mounted on and carried by the upper and lower 14 and 16 of the clamp. A spring mechanism associated with the clamp (not shown in the drawings) normally biases the jaws toward each other to hold the housings 24 and 26 in end to end abutment as shown.

The sensors 28 and 30 (FIG. 7) may each be a semi-circular, tubular shaped piece of hard magnetic material. Each of the sensors has a hollow, longitudinally extending interior chamber 32. Each of the sensors 28 and 30 further has a coil such as 36 (FIG. 7) wound longitudinally about the same. Each longitudinal coil is made of turns of wire, each turn extending through the interior chamber of the sensor and then around the outer periphery thereof. The coils 36 extend longitudinally along their corresponding sensors from end to end thereof. Each of the sensors 28 and 30 also has a coil 38 wound circumferentially about it. The circumferential coils 38 are preferably wound about the exterior of the sensors and extend substantially from end to end thereof. As shown in FIG. 7, the longitudinal coils of the two sensors are connected in parallel and may be energized through leads 40. The circumferential coils 38 are likewise connected in parallel and may be energized through leads 42. It will be understood that for simplicity in FIG. 7 only several turns of each of the coils 36 and 38 has been illustrated. In the actual device there may be many more turns in these coils. The number of turns of the coils depends upon a number of factors such as the output power of the power source hereafter described.

The semi-circular sensors 28 and 30 are mounted within respective hollow rectangular blocks such as 44 (FIG. 5) which may be made of brass. Each block has an arcuate recesses 45 formed in the edges of the sidewalls thereof. Each sensor is rigidly mounted within one of the blocks 44 in the position shown in phantom lines shown in FIG. 4, adjacent the recesses 45. Each block 44 in turn slidably fits within one of the hollow rectangular housings such as 24 shown in FIG. 4. The housings have conformably shaped and positioned recesses 46 formed in the edges of the sidewalls thereof. The housings 24 and 26 (FIG. 1) are preferably made of a high mu material having low retentivity in order to shield the sensors held within the blocks from extraneous magnetic fields, i.e., those emanating from sources other than the wire 52 (FIG. 2) carrying the current to be measured.

After the coils are wound about the sensors, each of the sensors may be encased in a suitable plastic material 48 such as epoxy resin in order to rigidly position the sensor within one of the blocks 44. Suitable electric coupling mechanisms are provided so that when the completed blocks 44 are inserted into corresponding ones of the housings 24 and 26, electrical connections may be readily made between the wires 40 or 42 (FIG. 7) connected to the coils and wires such as 50 (FIGS. 1 and 2) connected to a power source.

The recesses 45 in the sidewalls of the blocks 44 preferably have the same radius as the recesses 46 in the sidewalls of the housings. In one inserted position, the blocks 44 are in the positions shown in FIG. 2 wherein the edges of the recesses 45 in the blocks are immediately adjacent to, and coincide with, the edges of the recesses 46 in the housings. Preferably in this orientation the opposing ends of the sensors 28 and 30 contact each other when the housings are clamped together as seen in FIG. 1.

Figure 2:
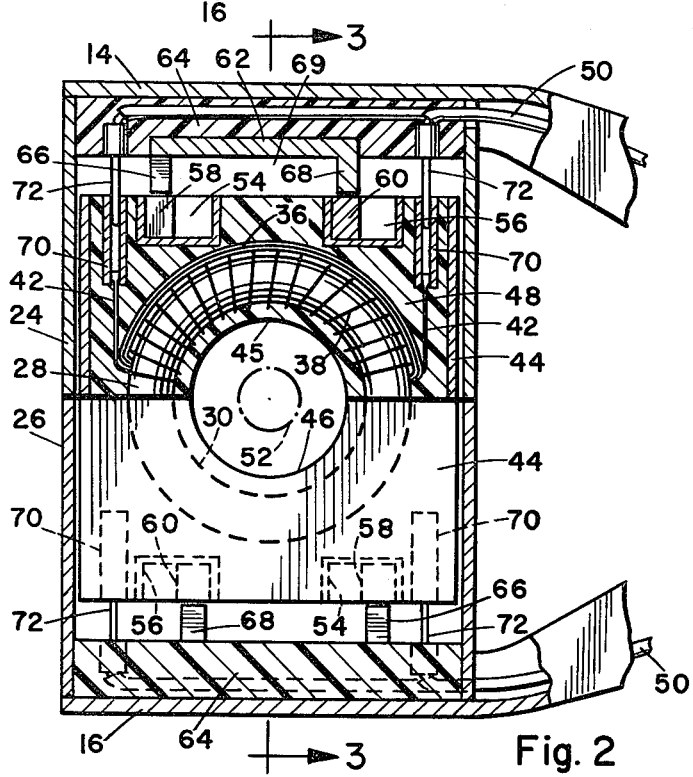
FIG. 2 is an enlarged, side elevation view of the head assembly of the clamp of FIG. 1 with portions cut away to show the manner in which the magnetic sensors are supported within respective blocks received in housings carried by the jaws of the clamp and the manner in which the coils wound about the sensors may be electrically connected to a current source.
Figure 4:
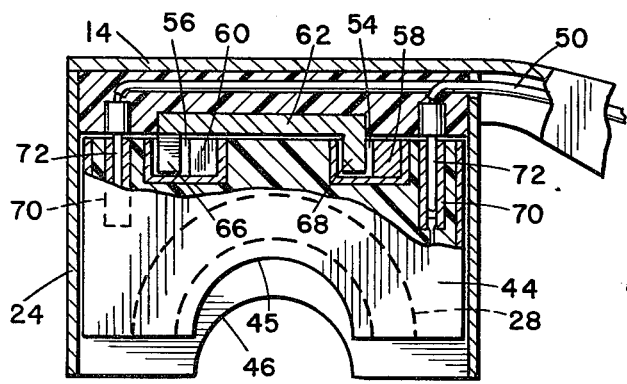
FIG. 4 is a view similar to a portion of FIG. 2 illustrating the manner in which the relative spacing between the sensors may be altered.

When the blocks 44 are in their positions shown in FIG. 2 within the housings, the blocks may be withdrawn from the housings, turned around 180 degrees and then reinserted into the housings. When this is done, the blocks will then be farther removed away from the recesses 46 in the sidewalls of the housings as shown in FIG. 4. Thus, when the housings are clamped together about a wire, the ends or poles of the sensors 28 and 30 will now be spaced apart. This may be accomplished with a key structure in the remote ends of the blocks and in the ends of the housings which is hereafter described.

The key structure permits the sensitivity or current measuring range of the device to be altered. Thus, when the sensors are in positions illustrated in FIG. 2, the device can be used to measure smaller currents than when the blocks are inserted into the housings in the alignment shown in FIG. 4. The FIG. 4 alignment is utilized to measure currents of substantially greater amplitude than that shown in FIG. 2. It will be understood that a current carrying wire such as 52 (FIG. 2) need not be positioned centrally of the circular aperture formed by the recesses 46 in the housings in order to make a measurement. All that is required to make a measurement is for the sensors to surround the current carrying wire.

As previously indicated, a preferred means for changing the proximity of the sensors 28 and 30 to each other may comprise a key mechanism. If the current through the wire 52 is expected to be in a range which is greater than that which can be measured with the magnetic sensors mounted as shown in FIG. 2, the relative positioning of the sensors within the housings can be changed to that shown in FIG. 4.

Figure 3:
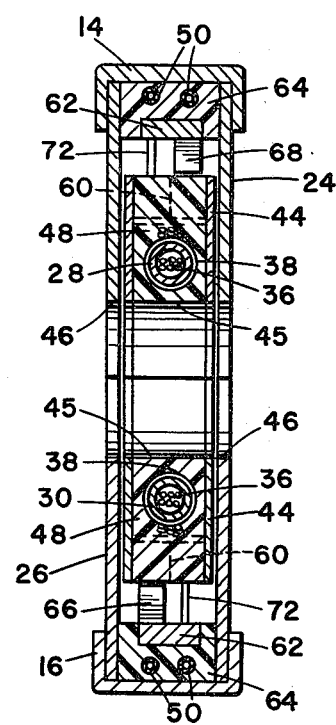
FIG. 3 is a vertical sectional view taken along line 3—3 of FIG. 2.
Figure 5:
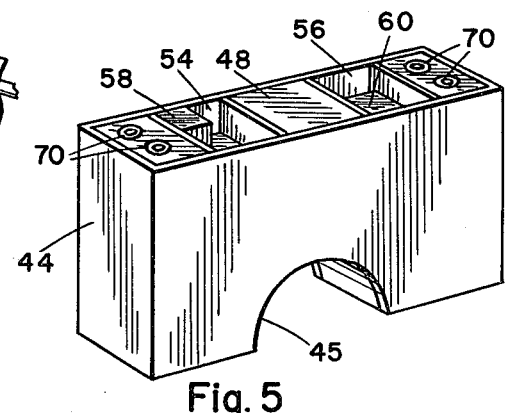
FIG. 5 is a perspective view of one of the blocks which holds a sensor.

As shown in FIG. 5, the remote ends of each of the blocks 44 may be provided with rectangular receptacles 54 and 56 having obstruction cubes 58 and 60, respectively. The cubes are rigidly fixed in preselected quadrants of the receptacles. The ends of the housings have key elements such as 62 (FIG. 2) supported therein and rigidly fixed in a quantity of suitable plastic 64 such as hardened epoxy resin. As shown in FIGS. 2 and 3, each of the key elements 62 includes a pair of extensions 66 and 68 which extend toward the recess 45 in the sidewall of the block 44. The extensions 66 and 68 preferably have a rectangular shape and have a volume slightly less than one-fourth of that of one of the receptacles 54 and 56. One of the extensions 66 or 68 (FIG. 3) may be positioned on one side of base of the key element and the other one of the extensions may be positioned on the other side of the key element.

The distance between the key elements 66 and 68 is such that when a block 44 is inserted within the housings 24, the extension 66 abuts the obstruction cube 58 in end to end fashion as shown in FIG. 2. Likewise the extension 68 abuts the obstruction 60 in end to end fashion. This creates a space 69 between the end of the block and the bottom of the housing. However, when the block 44 is withdrawn from the housing 24, rotated 180 degrees and thereafter reinserted into the housing 24, the block 44 assumes the position shown in FIG. 4. In this alignment the extension 66 fits into the receptacle 54 on the other side of the obstruction cube 58. Likewise the extension 68 fits within the receptacle 56 on the other side of the obstruction cube 60. In this alignment the end of the block abuts the bottom of the housing, eliminating the space 69 (FIG. 2) which formerly separated the two.

It will be understood that much more elaborate keying arrangements may be designed so that more than two spacings can be achieved with the same two blocks. This may be done by constructing the receptacles, obstruction cubes and extensions so that different relative spacings between the sensors may be achieved by changing the alignment of the blocks in their respective housings, or by switching the blocks between the housings.

Any suitable mechanism for establishing electrical connections between the coils wound about the sensors and the power supply wires 50 (FIG. 2) may be utilized. In the embodiment shown, cylindrical sleeves such as 70 are rigidly mounted in the plastic 64 at opposite ends of the blocks 44. The leads such as 42 (FIGS. 2 and 7) may be connected to the ends of the sleeves which are closest to the sensors. Electrical connector pins such as 72 (FIG. 2) may have their bases rigidly secured in the plastic 64 at opposite ends of the housings so that the extended portions thereof can be received in the sleeves 70. The pins in turn are connected to the power supply wires 50.

As shown in FIG. 5, there may be two sleeves 70 positioned in side by side relationship at each end of a block 44. Preferably the sleeves are connected to the leads 40 connected to the longitudinal coils 36 so that these coils may be energized whether the blocks are inserted as shown in FIG. 2 or as shown in FIG. 4. Multiple power supply wires 50 may extend through the clamp and the plastic 64 at the ends of the housings to connect with the bases of the pins 72.

FIG. 6 illustrates another means for changing the sensitivity or the current measuring range of the device. A rectangular hollow shunt 74 may be slide over each of the housings after the corresponding block has been inserted into the housing. The sidewalls of the shunt have arcuate recesses 76 formed therein which have a radius equal to that of the recesses 45 and 46 formed in the blocks and housings respectively. The recesses 76 in the sidewalls of the shunt may be spaced from the recesses 46 in the sidewalls of the housing when the shunt is completely slid over the housing as shown in FIG. 6. The recesses 76 on the upper and lower mating shunts thus define an aperture through which the current carrying wire 52 passes when the clamp 12 is clamped thereabove. The shunts 74 are preferably made of a soft magnetic material so that a major portion of the magnetic flux emanating from the current carrying wire will be absorbed by shunt and only the remaining portion will affect the sensors. The shunts 74 may be utilized if currents of such considerable amplitude are to be measured, that it is desirable to reduce the sensitivity of the device.

FIG. 8 illustrates a preferred form of an instrument 78 which may be utilized to support the blocks 44 in side by side relationship beneath a compass 80 so that the magnetic flux imparted in the sensors within the blocks can be measured. The instrument includes a planar base 82 and a pair of vertical support posts 84 which extend from opposite corners of the base. The compass 80 is mounted in a planar beam 86 having arcuate notches 88 at opposite ends thereof for receiving the support posts 84. The length of the beam is sufficient so that the beam can be removably inserted between the support posts 84 to place the compass carried by the beam immediately above the juxtaposed blocks 44. A plurality of contact pins 90 extend vertically from a printed circuit board 92 attached to the upper surface of the base 82. The contact pins 92 are positioned and sized to be inserted into the sleeves 70 (FIGS. 2 and 5) of the blocks. In FIG. 8 there are eight contact pins 90 which are positioned in pairs so that the two blocks 44 can be plugged onto the pins in side by side relationship as shown in FIG. 8. Thereafter the beam 86 carrying the compass can be inserted between the support posts.

Preferably the printed circuit board 92 electrically interconnects preselected ones of the pins 90 so that the circumferentially wound coils of the sensors can be simultaneously energized through a pair of female electrical jacks 94 carried in a jack housing 96 mounted to the upper surface of the base 82. As explained more fully hereafter, in one preferred form of the method of the present invention the circumferentially wound coils of the sensors may be simultaneously energized when the blocks are mounted on the instrument 78 as shown in FIG. 8. This moves the compass needle 98 back to North by cancelling the magnetic flux previously induced in the sensors when they were clamped around the current carrying wire.

While a preferred form of an instrument for cancelling the magnetic flux induced in the sensors has been illustrated in FIG. 8, it will be understood that it may be constructed in any fashion that will serve the same purpose. For example, the compass could be replaced with any magnetically sensitive needle and means for supporting the needle for movement away from and back to a normal position under the temporary influence of a magnetic field. The base 82, posts 84, beam 86 and PC board 92 could be replaced with any suitable means for supporting the sensors adjacent the magnetically sensitive needle to cause the needle to move to a deflected position.

A first embodiment of the method of the present invention will now be described. The blocks carrying the sensors are inserted into the housings carried by the clamp jaws. The alignment of the blocks within the housings is chosen in advance so that the key mechanism previously described will provide the relative spacing desired between the sensors when the sensors are clamped about the wire carrying the DC current which is to be measured. If necessary the shunts 74 are slid over the housings.

Next the clamp handles 18 and 20 are operated by the hand of a user to open and thereafter close the jaws of the clamp and thus form the sensors into a split ring about the current carrying wire. As shown schematically in FIG. 9, the longitudinally wound coils 36 of the sensors 28 and 30 are connected to an AC current source 100 through variable transformer 102 such as that sold under the trademark VARIAC.

The variable transformer 102 is next operated to send a transient signal in the form of an AC current pulse through the longitudinal coils. This AC current pulse first increases to a predetermined amplitude and thereafter decreases to zero. During the AC current pulse, the magnetic field emanating from the wire 52 about which the sensors have been clamped interacts with the magnetic field produced by the energized longitudinal coils wound about the sensors. The current in the longitudinal coils creates a magnetic field which is orthogonal to the magnetic field emanating from the wire 52. The resultant magnetic flux induced in the sensors 28 and 30 is proportional to the amplitude of the DC current flowing the wire 52.

Next the clamp is demounted from around the wire and the blocks 44 are removed from the housings of the clamp. The blocks are then mounted on the instrument 78 in side by side relationship as shown in FIG. 8 so that like poles of the sensors are adjacent to each other. The beam 86 carrying the compass 80 is inserted between the support posts 84. The beam 86 is lowered to place the compass 80 a predetermined height above the upper ends of the blocks 44.

The compass needle 98 normally points toward North when the compass is not under the influence of the magnetic sensors. Preferably the instrument 78 is aligned so that without the blocks 44 present on the instrument, the compass needle 98 points towards North and the pointing end of the needle rests above the North designation on the face of the compass. When the blocks 44 are mounted on the instrument 78 and the compass 80 is thereafter positioned above the block as shown in FIG. 8, the magnetic flux previously induced in the sensors within the blocks 44 deflects the compass needle away from North. The amount of deflection of the compass needle is proportional to the amount of magnetic flux previously induced in the sensors when they were clamped around the DC carrying wire.

As shown in FIG. 10, the circumferential coils 38 are connected in parallel to a DC current source 104 through a potentiometer 106. The potentiometer 106 is operated to gradually increase the DC current supplied to the circumferential coils from zero to an amplitude which is sufficient to cancel the magnetic flux previously induced in the sensors. It will be noted that the lines of force of the magnetic field produced by the energized circumferential coils 38 in FIG. 10 are parallel to the lines of force of the magnetic field emanating from the sensors as a result of the magnetic flux previously induced in them when they were positioned about the current carrying wire 52. The amount of DC current which is required to cancel the magnetic flux previously induced in the sensors is determined by observing the compass needle 98. When the indicator portion of the compass needle 98 returns back to North, a scale (not shown) associated with the potentiometer 106 is read. This scale is calibrated to read out directly the amount of DC current flowing through the wire 52.

A second embodiment of the method of the present invention will now be described. The sensors are clamped around the DC current carrying wire as before. A transient signal is then applied to the longitudinal coils 36 which is sufficient to induce a magnetic flux in the sensors which is proportional to the amount of DC current flowing through the wire 52. The wave form of the transient signal applied to the longitudinal coils is not critical. Next the sensors are unclamped from around the wire 52. The circumferential coils 38 are then connected in parallel to a ballistic galvanometer 108 (FIG. 11). Preferably, there are extra sleeves and pins for connecting the leads 42 connected to the circumferential coils to extra power supply wires extending along the clamp. This makes it unnecessary to remove the blocks 44 from the housings of the clamp in order to connect the galvanometer to the circumferential coils. Next a transient signal similar to that previously applied when the sensors were around the current carrying wire, is once again applied to the longitudinal coils 36. Since the sensors are no longer surrounding the current carrying wire, the transient signal applied to the longitudinal coils causes the magnetic flux previously induced in the sensors to be cancelled. The change in magnetic flux is measured by the ballistic galvanometer 108 which provides an indicaton of the amount of DC current flowing through the wire 52 about which the sensors were previously clamped. In FIG. 11, a transient signal which is applied to the longitudinal coils is generated by closing and opening a switch 110 so that DC current from a source 112 can be applied to the longitudinal coils through a resistor 114.

The wave form of the transient signal which is applied to the longitudinal coils when the sensors are clamped around the DC current carrying wire is not critical. In the second embodiment of the method of the present invention just described, switch 110 may be a twelve position switch which is operated to reverse the direction of the DC current supplied to the longitudinal coils twelve times. Each reversal reduces the amplitude of the current supplied to the longitudinal coils by a predetermined amount so that the current supplied to the coils is zero after twelve reverses. The aforementioned DC signal which is reduced in amplitude stepwise is applied to the longitudinal coils when they are around the current carrying wire, prior to the connection of the ballistic galvanometer. In some instances a single pulse of DC current applied to the longitudinal coils may suffice.

It is not necessary that the sensors have longitudinal coils. However, where the sensors have only circumferential coils a certain type of signal must be applied thereto when the sensors are clamped around the DC current carrying wire. A single pulse of DC current through the circumferential coils would not suffice. Thus, in a third embodiment of the method of the present invention, the sensors are clamped around the current carrying wire and the circumferential coils are connected to an AC current source through a variable transformer. The variable transformer is operated to increase the AC current applied to the circumferential coils from zero to a predetermined amplitude and then back to zero again. Thereafter the sensors are unclamped from around the wire and the blocks carrying the sensors are mounted in the alignment instrument (FIG. 8) as previously discussed in connection with the first embodiment of the method. The magnetic flux previously induced in the sensors is then cancelled to measure the amount of current flowing through the wire about which the sensors are clamped in the manner previously described in connection with FIG. 10.

Having described preferred embodiments of my method and apparatus, it will be apparent to those skilled in the art that the same may be modified in arrangement and detail. Therefore, my invention should be limited only in accordance with the scope of the following claims.

I claim:

1. An apparatus for measuring a DC current flowing through a wire comprising:
   a pair of semi-circular sensors made of a hard magnetic material;
   clamp means for removeably positioning the sensors into a split ring about the wire;
   means for generating a magnetic field about the sensors which interacts with the magnetic field emanating from the wire so that a magnetic flux is induced in the sensors having a magnitude proportional to the amplitude of the DC current flowing through the wire, the generating means including a pair of first coils longitudinally wound about corresponding ones of the sensors and means for applying a transient signal to the first coils; and
   means for simultaneously measuring the magnetic flux induced in both of the sensors after the sensors are removed from around the wire to thereby provide an indication of the amplitude of the DC current flowing through the wire, the measuring means including a pair of second coils circumferentially wound about corresponding ones of the sensors.

2. An apparatus according to claim 1 wherein the means for generating the magnetic field about sensors further includes:
   an AC current source;
   a variable transformer; and
   means for connecting the first coils to the AC current source through the variable transformer for applying an AC signal of varying amplitude to the first coils when the sensors are positioned about the wire.

3. An apparatus according to claim 1 wherein the measuring means further includes:

a magnetically sensitive needle;

means for supporting the needle for movement away from and back to a normal position;

means for supporting both of the sensors, after they have been removed from the clamp means, adjacent the needle so that the magnetic flux induced in the sensors deflects the needle away from its normal position;

means for applying a variable source of DC current to the second coils to produce a second magnetic field about the sensors to cancel the magnetic flux previously induced in the sensors when they surrounded the wire to permit the needle to return to its normal position; and means for providing an indication of the amplitude of the DC current applied to the second coils to thereby provide an indication of the amplitude of the DC current flowing through the wire.

4. An apparatus according to claim 1 wherein the measuring means further includes:

a ballistic galvanometer; and means for connecting the ballistic galvanometer to the second coils after the sensors have been removed from about the wire; and means for cancelling the magnetic flux previously induced in the sensors by the magnetic field emanating from the wire;

whereby the galvanometer will measure the change in magnetic flux in the sensors to provide an indication of the DC current flowing through the wire.

5. An apparatus according to claim 1 wherein;

the sensors are each supported in a block; and the clamp means includes an opposing pair of movable jaws each having a housing mounted thereto for receiving one of the blocks.

6. An apparatus according to claim 5 and further comprising means for varying the DC current measuring range of the apparatus.

7. An apparatus according to claim 6 wherein the means for varying the measuring range includes a key mechanism for permitting the relative spacing of the blocks within the housings to be altered.

8. An apparatus according to claim 6 wherein the means for varying the measuring range includes a pair of shunts each adapted to fit over one of the housings containing one of the sensors to absorb a portion of the magnetic field emanating from the current carrying wire.

9. An apparatus according to claim 5 wherein the housings are constructed to shield the sensors from stray magnetic fields other than the magnetic field emanating from the current carrying wire.

10. A method of measuring a DC current flowing through a wire comprising the steps of:

positioning a pair of semi-circular sensors made of a hard magnetic material into a split ring about the wire, the sensors each having a coil wound longitudinally therearound;

applying a transient signal to the longitudinal coils for generating a magnetic field about the sensors which interacts with the magnetic field emanating from the wire so that the magnetic flux is induced in the sensors having a magnitude proportional to the amplitude of the DC current flowing through the wire; and removing the sensors from around the wire and simultaneously measuring the magnetic flux previously induced in both of the sensors to provide an indication of the amplitude of the DC current flowing through the wire.

11. A method according to claim 10 wherein the magnitude flux induced in the sensors is measured by placing the sensors adjacent a magnetically sensitive needle so that the magnetic flux previously induced in the sensors deflects the needle away from a normal position, and by cancelling the magnetic flux previously induced in the sensors by applying a measurable DC current to a second pair of coils each wound circumferentially about one of the sensors, the measurable DC current applied to the second pair of coils having sufficient amplitude to permit the needle to return to its normal position.

12. A method according to claim 10 wherein the magnetic field is generated about the sensors when they are positioned about the wire by applying an AC current signal to the coils wound longitudinally about the sensors, the signal decreasing in amplitude from a predetermined value to zero.

13. A method according to claim 10 wherein the magnetic flux induced in the sensors is measured by connecting a ballistic galvanometer to a pair of second coils each circumferentially wound about one of the sensors and by applying the transient signal to the longitudinal coils a second time to cancel the magnetic flux previously induced in the sensors so that the ballistic galvanometer will measure the change in flux to provide an indication of the amplitude of the DC current flowing through the wire.

* * * * *